United States Patent
Fam et al.

(10) Patent No.: US 9,214,402 B2
(45) Date of Patent: Dec. 15, 2015

(54) PRESSURE SENSOR DEVICE WITH GEL RETAINER

(71) Applicants: Kee Cheong Fam, Kuala Lumpur (MY); Mohd Rusli Ibrahim, Shah Alam (MY); Lan Chu Tan, Singapore (SG)

(72) Inventors: Kee Cheong Fam, Kuala Lumpur (MY); Mohd Rusli Ibrahim, Shah Alam (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 93 days.

(21) Appl. No.: 14/151,811

(22) Filed: Jan. 10, 2014

(65) Prior Publication Data

US 2015/0200180 A1  Jul. 16, 2015

(51) Int. Cl.
  H01L 23/24    (2006.01)
  H01L 23/00    (2006.01)
  H01L 21/56    (2006.01)
  H01L 29/84    (2006.01)
  H01L 23/31    (2006.01)

(52) U.S. Cl.
  CPC .............. *H01L 23/24* (2013.01); *H01L 21/56* (2013.01); *H01L 23/3121* (2013.01); *H01L 23/3135* (2013.01); *H01L 24/83* (2013.01); *H01L 29/84* (2013.01); *H01L 2924/11* (2013.01); *H01L 2924/181* (2013.01)

(58) Field of Classification Search
  None
  See application file for complete search history.

(56) References Cited

U.S. PATENT DOCUMENTS

| | | |
|---|---|---|
| 5,454,270 A | 10/1995 | Brown |
| 5,996,419 A | 12/1999 | Sokn |
| 7,014,888 B2 | 3/2006 | McDonald |
| 7,506,548 B2 | 3/2009 | Fukuda |
| 7,793,550 B2 | 9/2010 | Elian |
| 7,900,521 B2 | 3/2011 | Hooper |
| 8,156,815 B2 | 4/2012 | Hunziker |
| 8,250,925 B2 | 8/2012 | Benzel |
| 8,276,460 B2 | 10/2012 | Bradley |
| 8,378,435 B2 | 2/2013 | Lo |
| 8,501,517 B1 * | 8/2013 | Yow et al. ............... 438/51 |
| 2013/0126988 A1 | 5/2013 | Lo |

\* cited by examiner

*Primary Examiner* — Bilkis Jahan
*Assistant Examiner* — Kevin Quinto
(74) *Attorney, Agent, or Firm* — Charles Bergere

(57) ABSTRACT

A pressure sensor device includes a gel retainer that is mounted or formed on a substrate. The gel retainer has a cavity and a pressure sensing die is mounted inside the cavity. The die is electrically connected to one or more other package elements. A pressure-sensitive gel material is dispensed into the cavity to cover an active region of the pressure sensing die. A mold compound is applied on an upper surface of the substrate outside of the gel retainer.

14 Claims, 3 Drawing Sheets

(E)

PRESSURE SENSOR DEVICE WITH GEL RETAINER

BACKGROUND

The present invention relates generally to semiconductor packaging, and, more particularly, to packaged semiconductor pressure sensor devices.

Semiconductor sensor devices, such as pressure sensors, are well known. Such devices use semiconductor pressure-sensing dies to sense the ambient atmospheric pressure. These dies are susceptible to mechanical damage during packaging and environmental damage when in use, and thus they must be carefully packaged. Further, pressure-sensing dies, such as piezo resistive transducers (PRTs) and parameterized layout cells (P-cells), do not allow full encapsulation because that would impede their functionality.

FIG. 1 shows a cross-sectional side view of a conventional package 100 having a substrate (e.g., a pre-molded lead frame) 102 upon which are mounted a micro-control unit (MCU) die 104, an acceleration-sensing die (G-cell) 106 using die-attach film or epoxy 110(1) and 110(2), respectively.

The MCU die 104 is wire-bonded to the substrate 102 with bond wires 112(1), and the G-cell 106 is wire-bonded to the MCU die 104 with bond wires 112(2). Mold compound 114 is applied over the substrate 102 to encase the G-cell 106, bond wires 112(1) and 112(2), and a portion of the MCU die 104. The space above the portion of the MCU die 104 that is not encased by the mold compound 114 forms a cavity 116.

After molding, a pressure-sensing die (P-cell) 108 is mounted inside the cavity 116 and on the MCU die 104 using a die-attach film or epoxy 110(3), and the die-attach film or epoxy 110(3) is cured by placing the partially assembled package 100 in an oven.

After curing, the P-cell 108 is wire-bonded to the MCU die 104 with bond wires 112(3), and the cavity 116 is filled with a pressure-sensitive gel material 118, which enables the pressure of the ambient atmosphere to reach the pressure-sensitive active region (not explicitly shown) on the top of the P-cell 108.

The above assembly process is not without difficulties. For example, (i) the mounting of the P-cell 108 is performed separately from the mounting of the MCU 104 and the G-cell 106, (ii) the curing of the die-attach film or epoxy 110(3) is performed separately from the curing of the die-attach film or epoxy 110(1) and 110(2), and (iii) the wire-bonding of bond wire(s) 112(3) is performed separately from the wire-bonding of bond wires 112(1) and 112(2). These separate mounting, curing, and wire-bonding steps add time and cost to the assembly process. Accordingly, it would be advantageous to have a more economical way to pressure sensor dies.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1:
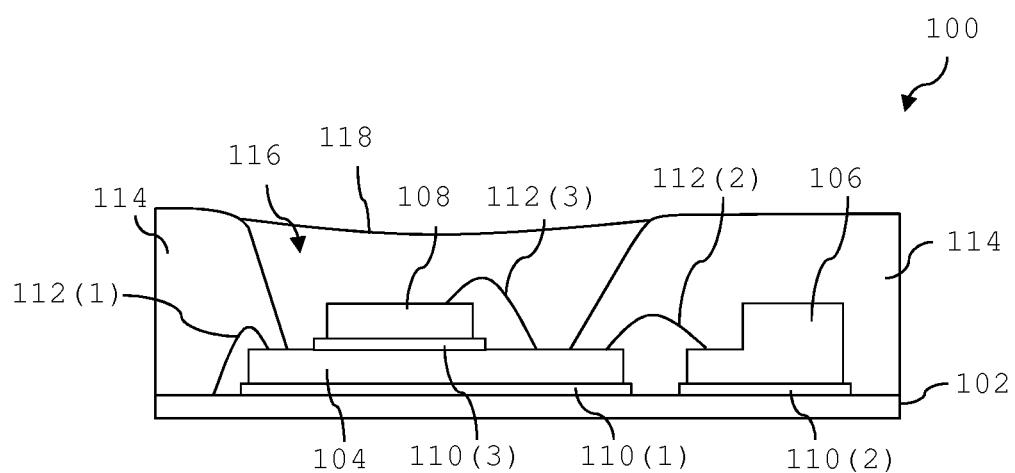
FIG. 1 shows a cross-sectional side view of a conventional multi-chip sensor package.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

One embodiment of the present invention is a method for assembling a packaged semiconductor device. A gel retainer having a cavity formed therein is mounted or formed on a substrate. A pressure-sensing die is mounted inside the cavity of the gel retainer, and then electrically connected to one or more other package elements. A pressure-sensitive gel material is applied within the cavity of the gel retainer to cover an active region of the pressure-sensing die.

Another embodiment of the present invention is a packaged semiconductor device comprising a substrate and a gel retainer mounted or formed on the substrate and having a cavity formed therein. A pressure-sensing die is mounted inside the cavity of the gel retainer, and one or more electrical interconnections are formed between the pressure-sensing die and at least one other package element. A pressure-sensitive gel material covers at least an active region of the pressure-sensing die within the cavity of the gel retainer.

Referring now to FIGS. 2(A)-(E), cross-sectional side views illustrating steps of an exemplary method of assembling a semiconductor package 200 according to one embodiment of the present invention are shown.

FIG. 2(A) illustrates a step of mounting or forming a gel retainer 220 on a substrate (e.g., a pre-molded leadframe) 202. The gel retainer 220 is a tube-like structure with walls 222 and a cavity 216 formed therethrough. The gel retainer 220 may be metal, plastic, or any other suitable material. Further, the gel retainer 220 may have a circular, oval, rectangular, triangular, or other shaped horizontal cross-section. Exemplary methods of mounting or forming the gel retainer 220 will be described in further detail below.

FIG. 2(B) illustrates a step of mounting a micro-control unit (MCU) die 204, an acceleration-sensing die (G-cell) 206, and a pressure-sensing die (P-cell) 208. The P-cell 208 is designed to sense ambient atmospheric pressure, while the G-cell 206 is designed to sense gravity or acceleration in one, two, or all three axes, depending on the particular implementation. The MCU die 204 controls, for example, the operations of and the processing of signals generated by the P-cell 208 and the G-cell 206. Note that, in some embodiments, the MCU 204 may implement both the functionality of an MCU and the functionality of one or more other sensors, such as an acceleration-sensing G-cell, in which latter case, the G-cell 206 may be omitted. Furthermore, in some embodiments, a single die functions as the MCU, the pressure-sensing die, and possibly one or more other sensors, in which case, the packaged device might have only that one die.

The MCU die 204, the G-cell 206, and the P-cell 208 are well-known components of semiconductor sensor devices and thus detailed descriptions thereof are not necessary for a complete understanding of the present invention.

As shown, the MCU die 204 and the P-cell 208 both are mounted inside the cavity 216 of the gel retainer 220. The MCU die 204 is mounted on the substrate 202 using a die-attach film or epoxy 210(1), and the P-cell 208 is mounted on the MCU die 204 using a die-attach film or epoxy 210(3). The G-cell 206 is mounted outside of the gel retainer 220 on the substrate 202 using a die-attach film or epoxy 210(2). After mounting, the semiconductor package 200 is placed in an oven (not shown) to cure the die-attach film or epoxy 210(1)-(3).

FIG. 2(C) illustrates a step of electrically interconnecting the components of the semiconductor package 200. As shown, an electrical interconnection is formed between the P-cell 208 and the MCU die 204 by wire-bonding the P-cell 208 to the MCU 204 with one or more bond wires 212(3).

To enable an electrical interconnection between the G-cell 206 and the MCU die 204, the substrate 202 has one or more leads or traces (not shown) that extend underneath the wall 222 of the gel retainer 220. The electrical interconnection between the G-cell 206 and the MCU die 204 is formed by (i) wire-bonding the MCU die 204 to one or more of such leads via one or more bond wires 212(1) and (ii) wire-bonding the G-cell 206 to those same leads via one or more bond wires 212(2).

Note that the MCU die 204 is also wire-bonded with one or more bond wires (not shown) to the substrate 202 to provide one or more electrical interconnections with the outside world. The bond wires 212(1)-(3) are formed from a conductive material such as (without limitation) aluminium, gold, or copper, and may be either coated or uncoated. Note that, in alternative designs, the P-cell 208 can be electrically connected to the MCU die 204, the MCU die 204 can be electrically connected to the substrate 202, and/or the G-cell 206 can be electrically connected to the substrate 202 using suitable flip-chip, solder-bump techniques instead of or in addition to wire-bonding.

FIG. 2(D) illustrates a step of dispensing a pressure-sensitive gel material 218, such as a silicon-based gel, into the cavity 216 of the gel retainer 220. The gel material 218 may be dispensed with a nozzle of a conventional dispensing machine (not shown), as is known in the art.

The gel material 218 is applied onto and around the P-cell 208, the MCU die 204, and the bond wires 212(1) and 212(3). The gel material 218 enables the pressure of the ambient atmosphere to reach the active region of the P-cell 208, while protecting the P-cell 208, the MCU die 204, and the bond wires 212(1) and 212(3) from (i) mechanical damage during packaging and (ii) environmental damage (e.g., contamination and/or corrosion) when in use. Examples of suitable gel material 218 are available from Dow Corning Corporation of Midland, Mich. Note that, at a minimum, the gel material 218 covers at least the pressure-sensitive active region on the top of the P-cell 208.

FIG. 2(E) illustrates a step of applying a mold compound 214 to the semiconductor package 200. The mold compound 214 may be a plastic, an epoxy, a silica-filled resin, a ceramic, a halide-free material, the like, or combinations thereof, as is known in the art. One way of applying the mold compound 214 is using a nozzle of a conventional dispensing machine, as is known in the art.

The mold compound 214 is applied on the upper surface of the substrate 202 and around the gel retainer 220 to encapsulate the G-cell 206 and bond wires 212(2). Note, however, that none of the mold compound 214 is applied within the cavity 216 of the gel retainer 220. A mold insert may be placed in or over the cavity 216 to prevent the mold compound 214 from being applied inside the gel retainer 220.

After applying the mold compound 214, a metal or plastic lid 224 may optionally be applied over the gel retainer 220 to protect the gel material 218, the MCU die 204, the P-cell 208, and the bond wires 212(1) and 212(3). Note that, if the lid 224 is applied, then the lid 224 should have a hole 226 formed therein to expose the pressure-sensitive active region on the top of the P-cell 208 to ambient atmospheric pressure outside of the semiconductor package 200.

Further, note that the lid 224 can also function as the mold insert when the mold compound 214 is applied such that the lid 224 gets sealed in place at the same time. A mold pin can be inserted into the hole 226 in the lid to prevent the mold compound from entering the cavity, or the hole 226 can be formed in the lid 224 after molding.

As described above, semiconductor package 200 may be assembled using as few as a single die-attachment stage (i.e., FIG. 2(B)), a single curing stage, and a single wire-bonding stage (i.e., FIG. 2(C)). By using fewer die-attach, curing, and wire-bonding stages than conventional pressure sensor device assembly processes, semiconductor packages of the present invention may be assembled in shorter amounts of time and at lower costs.

In some embodiments of the present invention, the gel retainer 220 may be pre-formed out of metal, plastic, or other suitable material, and mounted on the substrate 202 using, for example, a die-attach film or other suitable epoxy (not shown).

In other embodiments of the present invention, the gel retainer 220 may be formed by dispensing a solidifying liquid or gel material onto the upper surface of the substrate 202 in the shape of the gel retainer 220. For example, the gel retainer 220 may be formed by dispensing an epoxy ring on the substrate 202 using epoxy dispenser equipment (not shown), such as a suitable 3D printer.

Note that, in these embodiments, the gel retainer 220 can be mounted or formed onto the substrate 202 before the dies are mounted, after the dies are mounted but before wire-bonding, or after the dies are mounted and after wire-bonding.

In yet other embodiments of the present invention, the gel retainer 220 may be formed using photolithography. As an example, consider FIGS. 3(A)-3(D).

FIGS. 3(A)-(D) show cross-sectional side views of the steps of an exemplary method for forming a gel retainer 310 according to one embodiment of the present invention. The steps illustrated in FIGS. 3(A)-(D) may be used to form the gel retainer 220 in FIG. 2(A).

Figure 3:
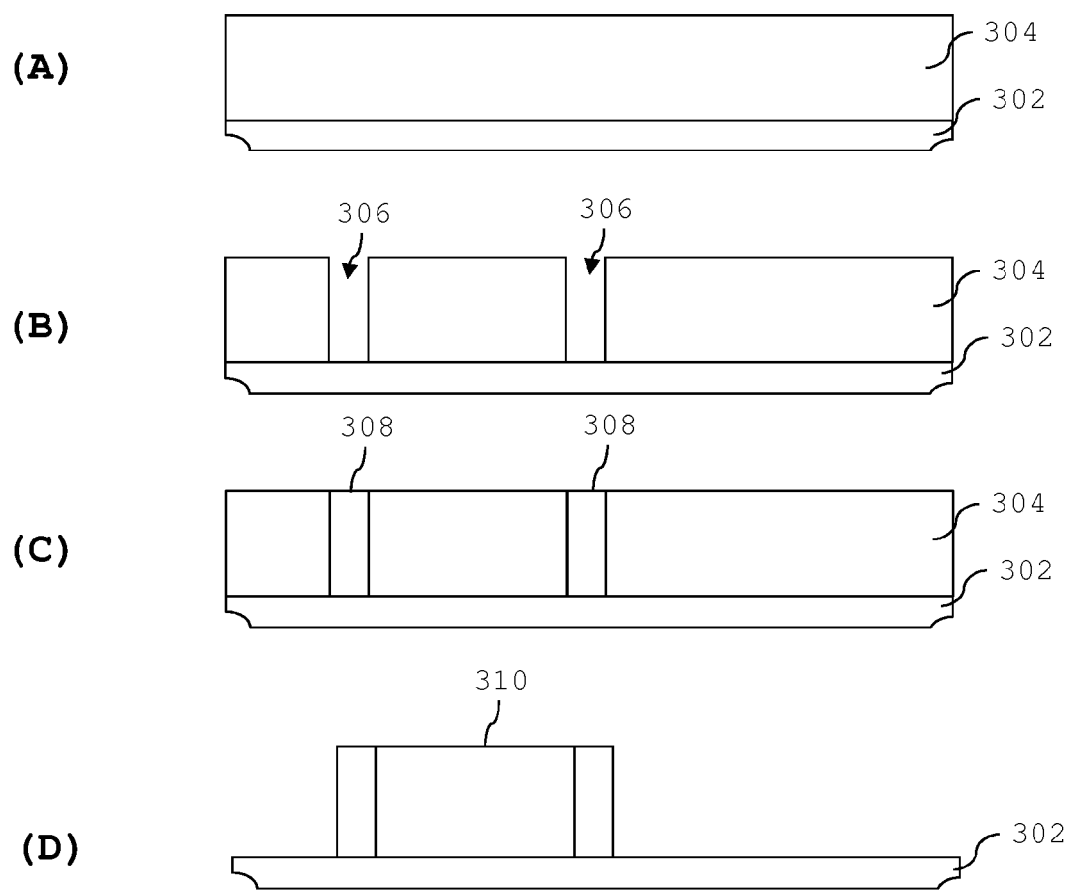
FIG. 3 shows cross-sectional side views that illustrate steps of an exemplary method for forming a gel retainer according to one embodiment of the present invention.

In FIG. 3(A), a photoresist 304 is applied onto an upper surface of a substrate 302. In FIG. 3(B), a channel 306 is formed in the photoresist 304 using photolithography techniques. The channel 306 may have a circular, oval, rectangular, triangular, or other shaped cross-section.

In FIG. 3(C), the channel 306 is filled with a material 308 to form the gel retainer 310. For example, the gel retainer 310 may be formed using copper plating. In FIG. 3(D), the photoresist 304 is stripped away, leaving only the gel retainer 310 on the upper surface of the substrate 302.

Figure 2:
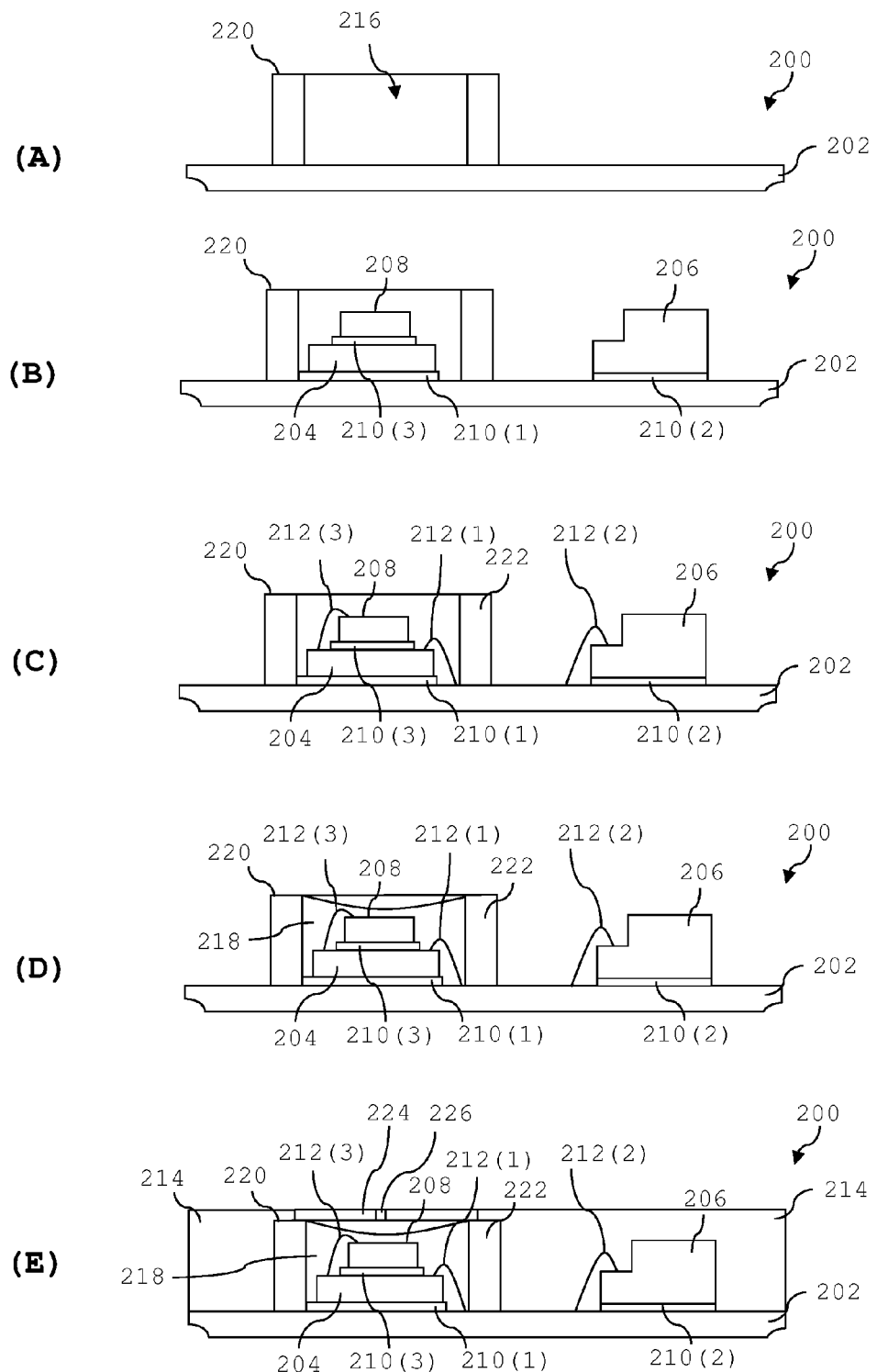
FIG. 2 shows cross-sectional side views that illustrate steps of an exemplary method of assembling a semiconductor package according to one embodiment of the present invention.

Although FIG. 2 shows the semiconductor package 200 having a P-cell 208 and a G-cell 206, those skilled in the art will understand that, in alternative embodiments, the G-cell and its corresponding bond wires may be omitted.

Further, although FIG. 2 shows the semiconductor package 200 having the P-cell 208 and the MCU 204 positioned within the cavity 216 of the gel retainer 220, those skilled in the art will understand that, in alternative embodiments, other configurations are possible. For example, the MCU 204 could be positioned outside of the gel retainer 220 such that it is encapsulated in the mold compound 214. As another example, the G-cell 206 may be positioned within the gel retainer 220.

It will be understood that, as used herein, the term "electrical interconnection" refers to a connection that may be made using one or more of bond wires, flip-chip bumps, traces, and other conductors used to electrically interconnect one die to another die or to a substrate, such as a leadframe.

Although FIG. 2 shows the assembly of only a single semiconductor package 200, those skilled in the art would recognize that the semiconductor package 200 may be assembled with other semiconductor packages in a one- or two-dimensional array of semiconductor packages on the substrate 200 and then subsequently separated using suitable saw singulation techniques.

Further, although FIG. 2 shows the gel material 218 being applied before applying the mold compound 214, those skilled in the art would recognize that the gel material 218 can be applied after applying the mold compound 214.

By now it should be appreciated that there has been provided an improved packaged semiconductor device and a method of forming the improved packaged semiconductor device. Circuit details are not disclosed because knowledge thereof is not required for a complete understanding of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A method for assembling a packaged semiconductor device, the method comprising:
   mounting or forming a gel retainer on a substrate, the gel retainer having a cavity formed therein;
   mounting a pressure-sensing die inside the cavity of the gel retainer;
   electrically connecting the pressure-sensing die to at least one other package element; and
   applying a pressure-sensitive gel material within the cavity of the gel retainer to cover at least an active region of the pressure-sensing die,
   wherein:
   mounting the pressure-sensing die comprises:
      mounting a control die on the substrate inside the gel retainer cavity;
      mounting the pressure-sensing die on the control die; and
      mounting an acceleration-sensing die on the substrate outside the gel retainer cavity; and
   electrically connecting the pressure-sensing die comprises:
      electrically connecting the pressure-sensing die and the control die; and
      electrically connecting the control die and the acceleration-sensing die.

2. The method of claim 1, further comprising applying mold compound on an upper surface of the substrate outside of the gel retainer.

3. The method of claim 1, wherein mounting or forming the gel retainer comprises mounting the gel retainer on the substrate using a die-attach film or epoxy.

4. The method of claim 1, wherein mounting or forming the gel retainer comprises dispensing a solidifying liquid or gel on the substrate to form the gel retainer.

5. The method of claim 1, further comprising the step of encapsulating the acceleration-sensing die with a mold compound.

6. The method of claim 1, wherein:
   the substrate comprises at least one lead extending underneath a wall of the gel retainer; and electrically connecting the pressure-sensing die further comprises:
electrically connecting the control die mounted inside the cavity of the gel retainer to the at least one lead; and
electrically connecting the acceleration-sensing die mounted outside the cavity of the gel retainer to the at least one lead to electrically interconnect the control die and the acceleration-sensing die.

7. A packaged semiconductor device assembled using the method of claim 1.

8. The method of claim 1, wherein the gel retainer is formed on the substrate using photolithography techniques.

9. The method of claim 8, wherein mounting or forming the gel retainer comprises:
applying a photoresist over the substrate; forming a channel in the photoresist using photolithography, wherein the channel has a shape of the gel retainer;
filling the channel with a solid material; and
stripping away the photoresist from the substrate to form the gel retainer.

10. A packaged semiconductor device, comprising:
a substrate;
a gel retainer mounted or formed on the substrate and having a cavity formed therein;
a control die mounted on the substrate inside the cavity of the gel retainer;
a pressure-sensing die mounted on the control die inside the cavity of the gel retainer;
one or more electrical interconnections between the pressure-sensing die and at least one other package element;
pressure-sensitive gel material covering at least an active region of the pressure-sensing die within the cavity of the gel retainer;
an acceleration-sensing die mounted on the substrate outside the gel retainer; and
one or more other electrical interconnections (i) between the pressure-sensing die and the control die and (ii) between the acceleration-sensing die and the control die.

11. The packaged semiconductor device of claim 10, further comprising a mold compound on an upper surface of the substrate outside of the gel retainer.

12. The packaged semiconductor device of claim 10, further comprising a die-attach film or epoxy for attaching the gel retainer to the substrate.

13. The packaged semiconductor device of claim 10, wherein the mold compound encapsulates the acceleration-sensing die.

14. The packaged semiconductor device of claim 10, wherein:
the substrate comprises at least one lead extending underneath a wall of the gel retainer; and
the packaged semiconductor device further comprises one or more other electrical interconnections (i) between the control die mounted on the substrate inside the cavity of the gel retainer and the at least one lead and (ii) between the acceleration-sensing die mounted on the substrate outside the gel retainer and the at least one lead to electrically interconnect the control die and the acceleration-sensing die.

\* \* \* \* \*